US007425137B1

(12) United States Patent
Sipe et al.

(10) Patent No.: US 7,425,137 B1

(45) Date of Patent: Sep. 16, 2008

(54) CONNECTOR FOR STACKING CIRCUIT BOARDS

(75) Inventors: Lynn Robert Sipe, Mifflintown, PA (US); James Lee Fedder, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/715,153

(22) Filed: Mar. 7, 2007

(51) Int. Cl.
*H01R 12/00* (2006.01)
*H05K 1/00* (2006.01)

(52) U.S. Cl. .......................................... 439/74; 439/65

(58) Field of Classification Search .................. 439/74, 439/65, 651, 654, 628
See application file for complete search history.

(56) References Cited

U.S. PATENT DOCUMENTS 4,695,112 A * 9/1987 Maston et al. .............. 439/350
5,137,462 A * 8/1992 Casey et al. ................... 439/74
6,123,550 A * 9/2000 Burkert et al. ................ 439/63
6,210,177 B1 * 4/2001 Huang et al. .................. 439/74
6,341,966 B1 * 1/2002 Takada et al. ............... 439/108
6,371,803 B1 * 4/2002 Fan ............................ 439/570
6,457,980 B2 * 10/2002 Hattori et al. ................. 439/74
6,695,622 B2 * 2/2004 Korsunsky et al. ............ 439/65
6,814,620 B1 * 11/2004 Wu ............................ 439/608
6,918,774 B2 * 7/2005 Wu ............................. 439/65

* cited by examiner

*Primary Examiner*—Hae Moon Hyeon

(57) ABSTRACT

A connector assembly for connecting first and second circuit boards in a substantially parallel relationship includes a first connector matable to the first circuit board and a second connector matable to the second circuit board. A third connector is matable to the first and second connectors and is positioned therebetween. The third connector includes a wafer configured to provide a predetermined spacing between the first and second circuit boards.

15 Claims, 5 Drawing Sheets

CONNECTOR FOR STACKING CIRCUIT BOARDS

BACKGROUND OF THE INVENTION

The invention relates generally to electrical connectors and, more particularly, to a connector for interconnecting stacked circuit boards.

Modern electronic systems such as telecommunications systems and computer systems often include large circuit boards called backplane boards which are rack mounted or retained in cabinets and are electrically connected to a number of smaller circuit boards called daughter cards. Electrical connectors establish communications between the backplane and the daughter cards. In some applications, the daughter cards contain circuitry for driving the system and the backplane serves as a routing channel between daughter cards.

A need may arise to add components to a daughter card, such as, to add capability or upgrade the daughter card. Often this requires the addition of components to the daughter card. If space is not available on the daughter card, a mezzanine card may be used which may be stacked on the daughter card. A mezzanine connector is used to interconnect the mezzanine card and the daughter card. When the mezzanine card and daughter card are stacked, the mezzanine and daughter cards must be spaced apart a sufficient distance, called the stack height, so that clearance is provided for the components on the daughter card.

Typically, mezzanine connectors are two-piece connector systems that include a connector for the daughter card and one for the mezzanine card. The connectors are designed for a specific stack height, such that different connectors are required to meet different stack height requirements. For relatively high stack heights, such as for instance, twenty five millimeters or greater, multiple mezzanine connectors are some times stacked on top of one another to achieve a desired stack height. Consequently, connector systems tend to become more expensive as stack height increases. Stability and reliability may also become a concern as consideration must be given to the size and weight of the components and of the connectors themselves. Furthermore, some prior connector designs may also interfere with airflow or thermal management in the system.

A need exists for a connector that is configurable to provide the capability to vary the stack height between daughter cards and mezzanine cards. A further need exists for a connector that facilitates thermal management in the system by maintaining an air flow path between the mezzanine and daughter cards.

BRIEF DESCRIPTION OF THE INVENTION

In one embodiment, a connector assembly is provided for connecting first and second circuit boards in a substantially parallel relationship. The assembly includes a first connector configured to be mounted on the first circuit board and a second connector configured to be mounted on the second circuit board. A third connector is matable to the first and second connectors and is positioned therebetween. The third connector includes a wafer configured to provide a predetermined spacing between the first and second circuit boards.

Optionally, the third connector further includes a first shroud and a second shroud and the first and second shrouds hold the wafer. The first and second shrouds are identical to one another. The wafer includes a spacing tab that is configured to provide the predetermined spacing between the first and second circuit boards. The first and second shrouds have a plurality of grooves formed therein and the wafer includes retention barbs that engage bottom surfaces of the grooves to secure the wafer in the shrouds.

In another embodiment, a connector assembly is provided for connecting first and second circuit boards in a substantially parallel relationship. The assembly includes a first connector configured to be mounted on the first circuit board and a second connector configured to be mounted on the second circuit board. A third connector is matable to the first and second connectors and is positioned therebetween. The third connector includes a wafer that defines an air flow path through the third connector.

DETAILED DESCRIPTION OF THE INVENTION

Figure 1:
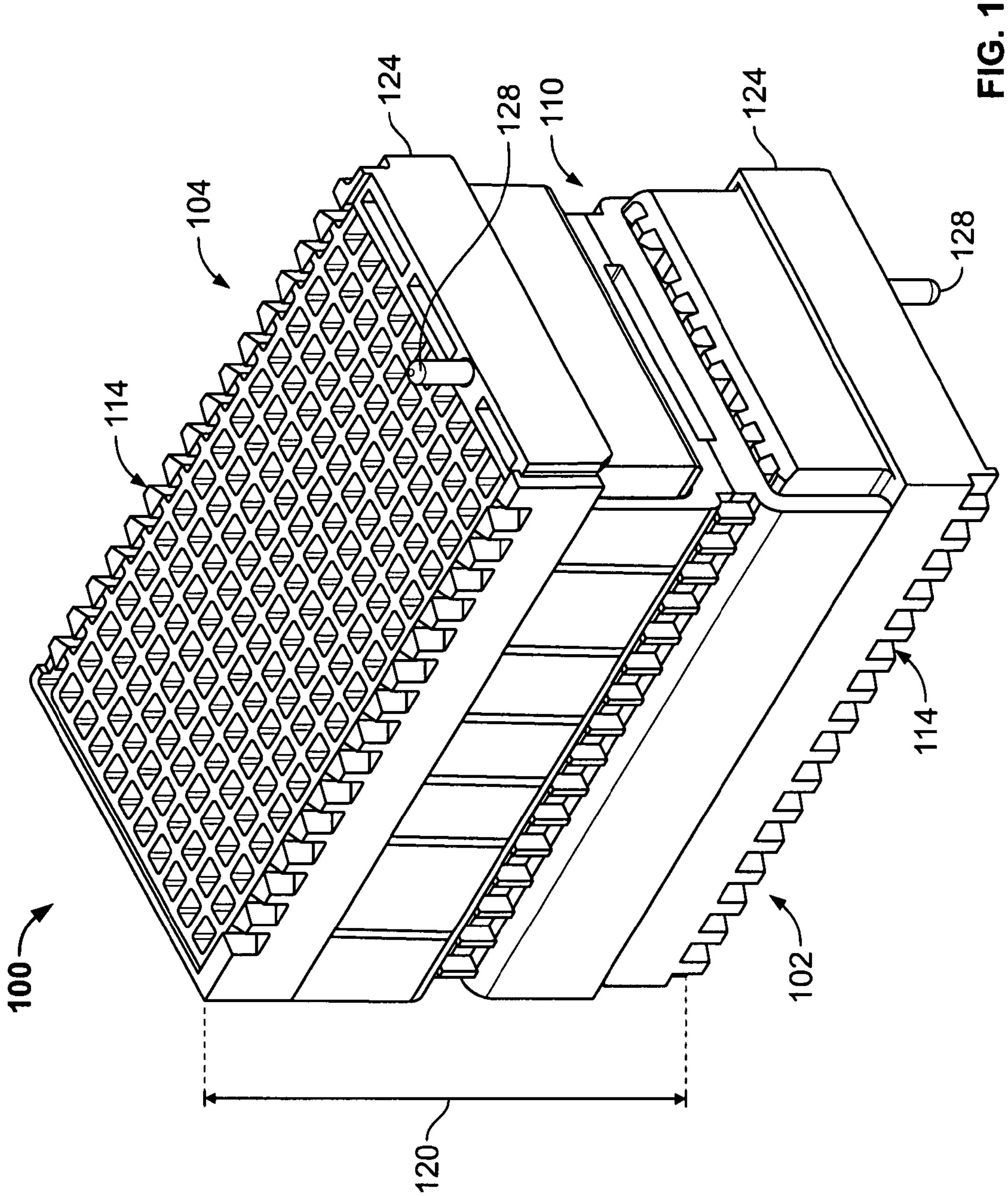
FIG. 1 is a perspective view of a connector assembly formed in accordance with an exemplary embodiment of the present invention.
Figure 2:
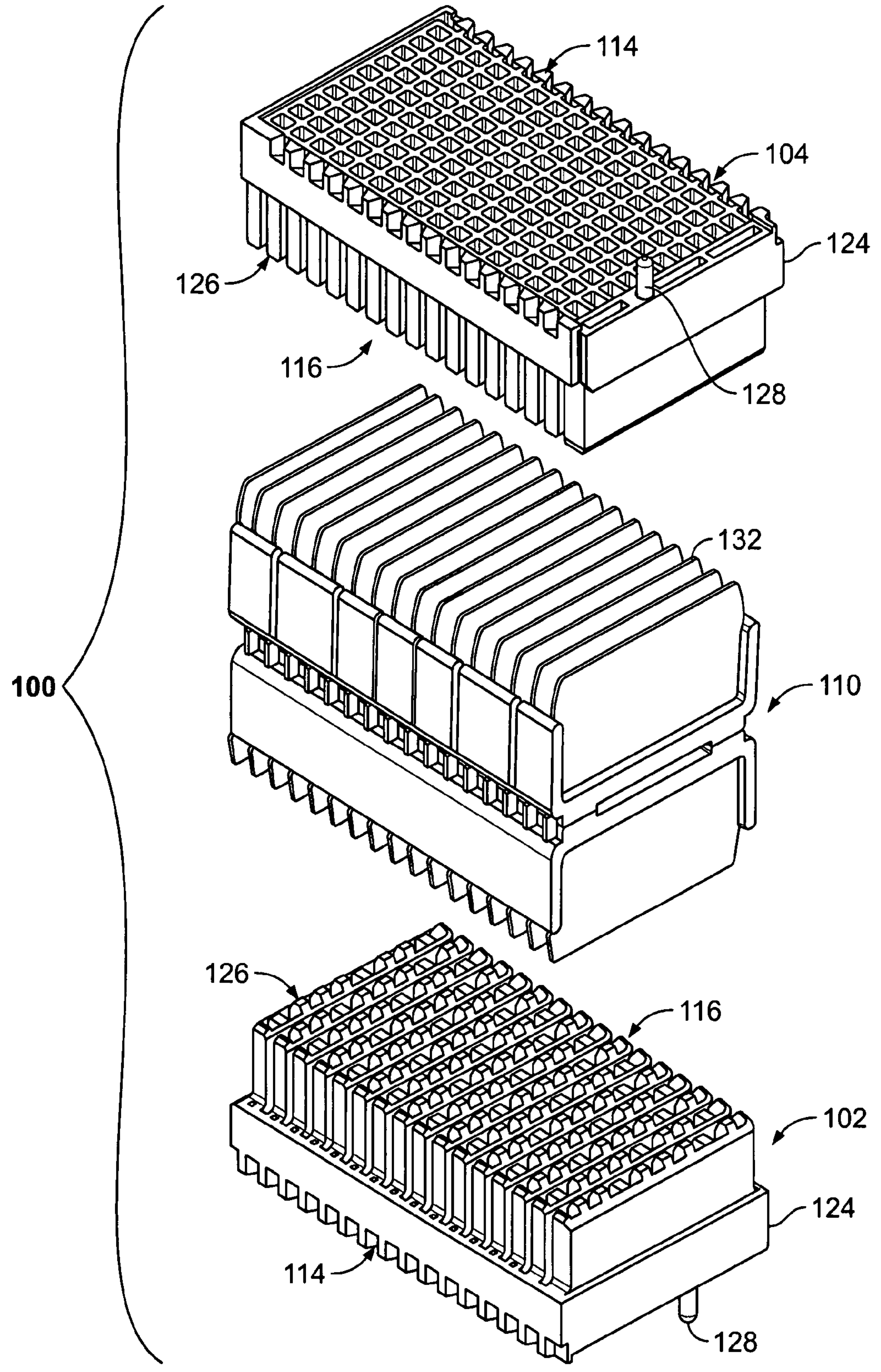
FIG. 2 is an exploded view of the connector assembly shown in FIG. 1.

FIG. 1 illustrates a perspective view of a connector assembly 100 formed in accordance with an exemplary embodiment of the present invention. FIG. 2 illustrates an exploded view of the connector assembly 100. The connector assembly 100 is a three-part assembly that includes a first connector 102, a second connector 104, and a third connector 110 that is positioned between the first and second connectors 102 and 104 and is configured to mate simultaneously with the first and second connectors 102 and 104 to interconnect the same. The assembly 100 will be described with particular reference to a mezzanine connector assembly for interconnecting circuit boards in a substantially parallel relationship. However, it is to be understood that the following description is for illustrative purposes only and the benefits described herein are also applicable to other connectors for interconnecting circuit boards.

In the exemplary embodiment, the first and second connectors, 102 and 104 may be backplane connectors that are identical to one another, and thus, are interchangeable. Each connector 102, 104 includes a mounting face 114 for mounting the connectors 102, 104 to a circuit board and a mating face 116 configured to mate with the third connector 110. For clarity in viewing the connector assembly 100 the circuit boards are not shown in FIGS. 1 and 2. The first connector 102 may be mounted on a daughter card and the second connector 104 may be mounted on a mezzanine card. The first and second connectors 102 and 104 may be standardized and the third connector 110 may be configured to provide a desired or predetermined stack height or spacing 120 between the daughter card and mezzanine card as will be described. The connector assembly 100 is particularly useful in applications requiring relatively high stack heights such as twenty-five millimeters or more. Hereafter, the third connector 110 will be referred to as the wafer/shroud sub-assembly 110.

The first and second connectors 102 and 104, each includes a housing base 124 that holds a contact system 126. In one embodiment, the first and second connectors 102 and 104 are configured for press fit installation on the daughter card and mezzanine card. The housing bases 124 are provided with alignment posts 128 to position the connectors 102 and 104 on the daughter and mezzanine cards. The contact systems 126 at the mating faces 116 of the first and second connectors 102 and 104 are configured to mate with contact wafers 132 in the wafer/shroud sub-assembly 110 as will be described.

Figure 3:
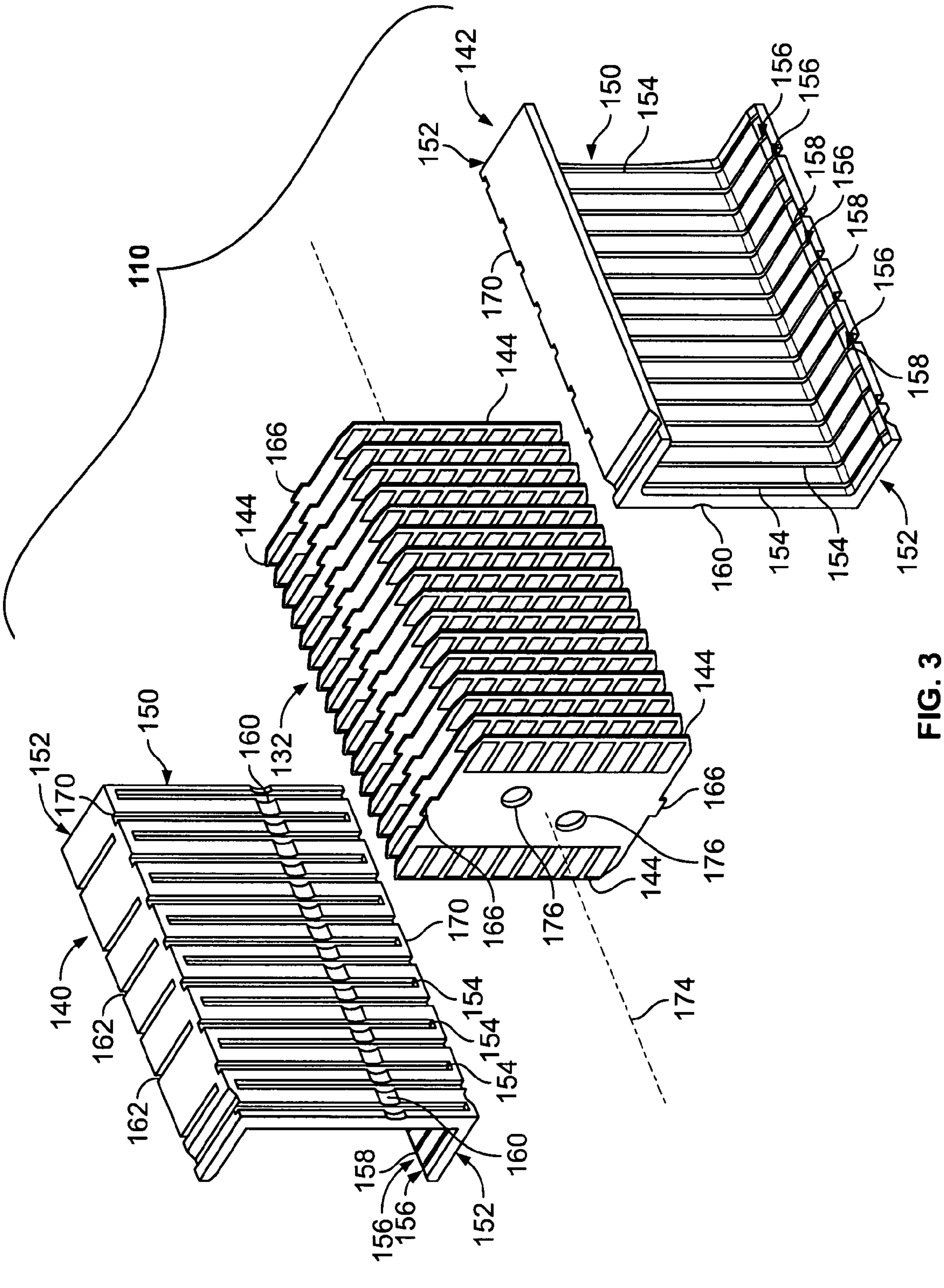
FIG. 3 is an exploded view of the mezzanine connector shown in FIG. 2.

FIG. 3 illustrates an exploded view of the wafer/shroud sub-assembly 110. In FIG. 3, the wafer/shroud sub-assembly 110 is rotated on its side relative to the position shown in FIGS. 1 and 2. The wafer/shroud sub-assembly 110 includes a first shroud 140 and a second shroud 142. Contact wafers 132 are held in the shrouds 140 and 142. Each contact wafer 132 has opposite mating edges 144. The shrouds 140 and 142 are identical to one another. Each shroud 140, 142 includes an inner wall 150 and flanges 152 that extend from the inner wall 150 in a substantially perpendicular relationship. A plurality of slots 154 are formed in the inner wall 150. A plurality of grooves 156 are formed in the inner side of each flange 152. The grooves 156 are aligned with the slots 154 but do not extend through the flanges 152 such that the grooves 156 have bottom surfaces 158. Each slot 154 receives a mating edge 144 of a contact wafer 132. The grooves 156 hold, stabilize, and align the contact wafers 132 in the shrouds 140 and 142. An inspection groove 160 is formed in the inner wall 150. Exterior molding grooves 162 are provided for dimensional control of the shrouds 140 and 142 during fabrication.

The mating edges 144 of the contact wafers 132 extend through the slots 154 in the shrouds 140 and 142 to electrically engage the contact systems 126 in the first and second connectors 102 and 104 (FIG. 2). Each contact wafer 132 includes spacing tabs 166 that engage edges 170 of the flanges to control a spacing between the shrouds 140 and 142 and also the stack height 120 (FIG. 1) between the daughter and mezzanine cards (not shown) when the wafer/shroud sub-assembly 110 is assembled. As illustrated in FIG. 3, the wafer/shroud sub-assembly 110 is a sixteen wafer assembly; however, the number of contact wafers 132 may be varied in other embodiments according to the needs of the particular application. The contact wafers 132 are arranged along an axis 174 and may rotated one hundred eighty degrees or flipped top to bottom about the axis 174 without affecting the performance of the connector assembly 100 (FIG. 1). Each contact wafer 132 is provided with inspection apertures 176. When the wafer/shroud sub-assembly 110 is assembled, the inspection grooves 160 in the shrouds 140 and 142 are aligned with the apertures 176 in the contact wafers such that a line of sight is formed through the sub-assembly 110 to verify proper positioning of the contact wafers 132 within the shrouds 140 and 142.

Figure 4:
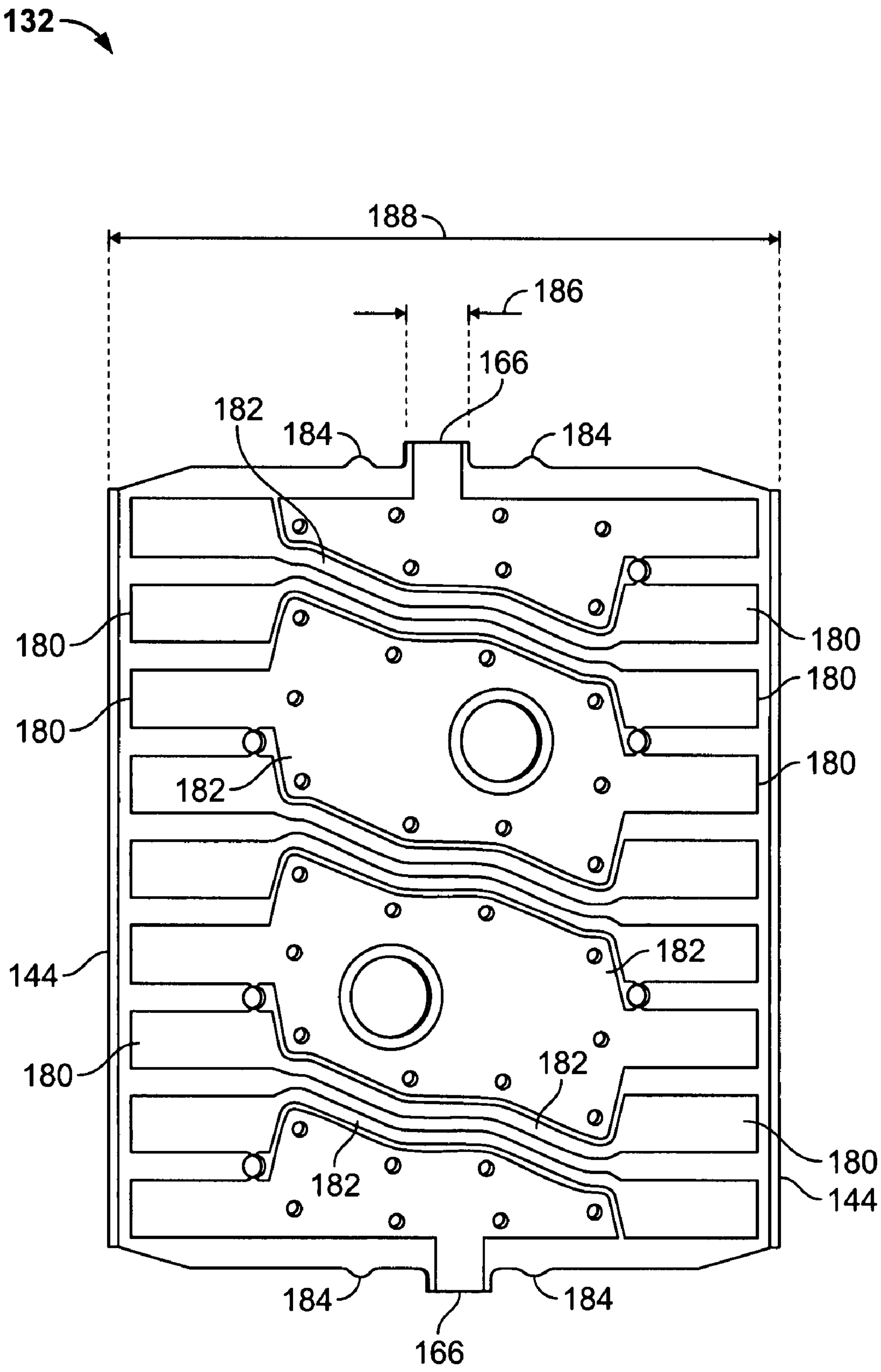
FIG. 4 is a front elevational view of a wafer shown in FIG. 3.

FIG. 4 illustrates a front elevational view of a contact wafer 132. Contact pads 180 are distributed along the mating edges 144 of the contact wafer 132. Conductive traces 182 connect the contact pads 180 on opposite mating edges 144 of the contact wafer 132. In the exemplary embodiment, contact pads 180 are provided on only one side of the contact wafer 132 so that the contact wafer 132 may not be reversed in the wafer/shroud sub-assembly 110. However, in some embodiments, traces 182 may be routed so that contact pads 180 may be located on both sides of the contact wafer 132. Retention barbs 184 frictionally engage the bottom surfaces 158 of the grooves 156 on the shrouds 140 and 142 (FIG. 3) to secure the contact wafers 132 in the shrouds 140 and 142. The spacing tab 166 has a height 186 and the contact wafer 132 has an overall height 188. The contact wafer 132 may be customized for particular application requirements such as for signal transmission or for power transfer.

Figure 6:
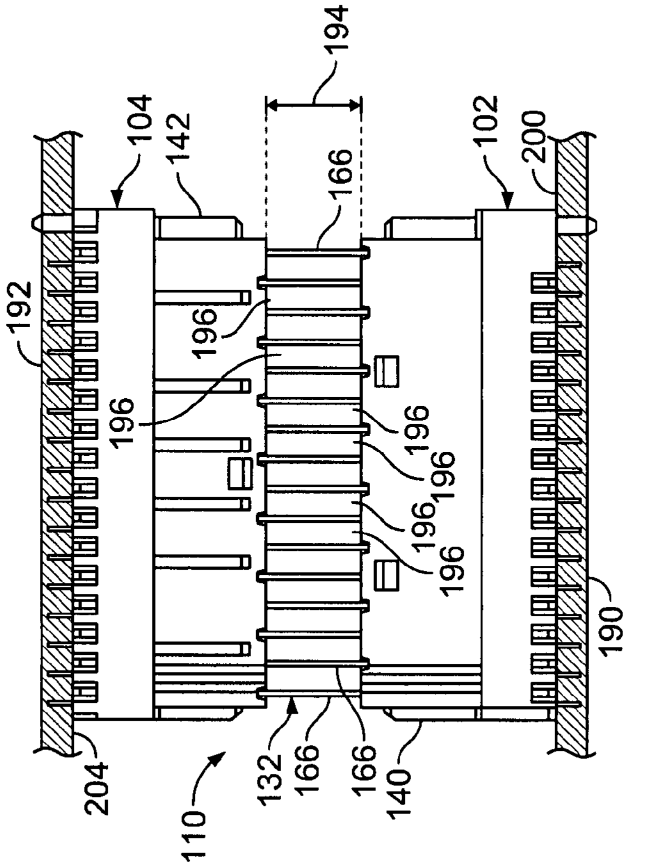
FIG. 6 is a front elevational view of the assembly shown in FIG. 5.
Figure 5:
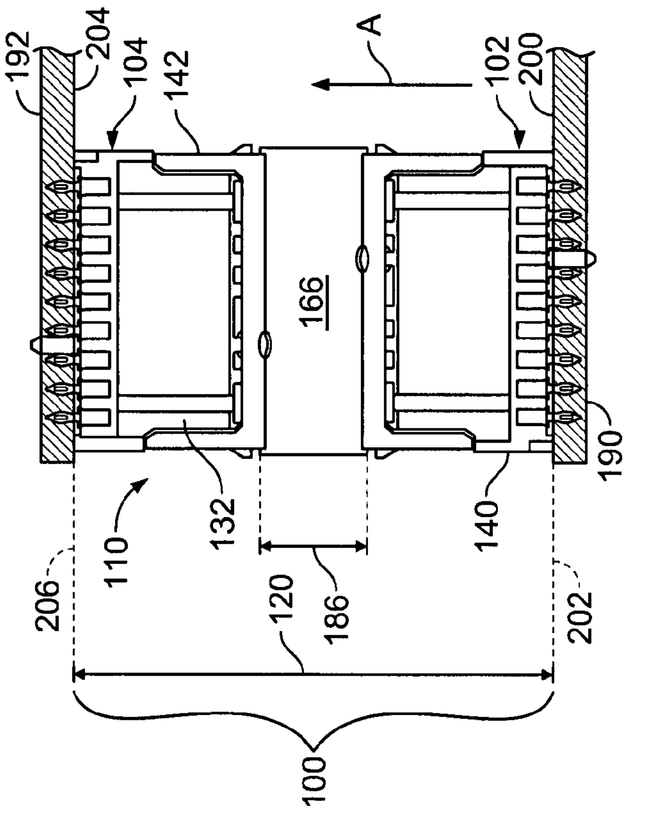
FIG. 5 is an end view of the connector assembly shown in FIG. 1 interconnecting a daughter card and a mezzanine card.

FIG. 5 illustrates an end view of the connector assembly 100 interconnecting a daughter card 190 and a mezzanine card 192. FIG. 6 is a front elevational view of the assembly 100 shown in FIG. 5. The first connector 102 is mounted on the daughter card 190. The second connector 104 is mounted on the mezzanine card 192. The third or wafer/shroud sub-assembly 110 is mated to the first and second connectors 102 and 104 and is positioned between the first and second connectors 102 and 104. The contact wafers 132 in the wafer/shroud sub-assembly 110 are sized to provide a desired stack height 120 between the daughter card 190 and the mezzanine card 192. More specifically, the height 186 of the spacing tab 166 is established to provide the desired stack height 120 between the daughter card 190 and the mezzanine card 192. As the height 186 of the spacing tab 166 is changed, the overall height 188 (FIG. 4) of the contact wafer 132 is changed a corresponding amount. That is, the mating portion of the contact wafer 132 as well as the shrouds 140 and 142 remain unchanged as the overall height 188 of the contact wafer is varied.

The spacing tabs 166 on the contact wafers 132 also establish a spacing 194 between the shrouds 140 and 142 of the wafer/shroud sub-assembly 110. The spacing tabs 166 on the contact wafers 132 define a plurality of air flow paths 196 between the shrouds 140 and 142 through the wafer/shroud sub-assembly 110.

The daughter card 190 has a connector mounting surface 200 that lies in a plane 202. The first connector 102 is mounted on the mounting surface 200. The mezzanine card 192 has a connector mounting surface 204 that lies in a plane 206 that is substantially parallel to the plane 202 of the mounting surface 200 of the daughter card 190. The second connector 104 is mounted on the mounting surface 204. The mounting surface 200 of the daughter card 190 faces the mounting surface 204 of the mezzanine card 192. The connectors 102, 104, and the sub-assembly 110 are stacked along the direction of the arrow A which is transverse to the parallel planes 202 and 206 of the daughter card 190 and mezzanine card 192, respectively. Further, the contact wafers 132 are held within the wafer/shroud sub-assembly 110 in a perpendicular orientation with respect to the planes 202 and 206 containing the mounting surfaces 200 and 204 of the daughter card 190 and mezzanine card 192.

The embodiments thus described provide a connector assembly that is particularly suited for applications requiring a stack height of fifteen millimeters or more. The assembly is a three part system having interchangeable backplane connectors on the daughter card and mezzanine card and a wafer/shroud sub-assembly that interconnects the two backplane connectors. The wafer/shroud sub-assembly includes a wafer system that allows the stack height to be changed by changing the wafers in the wafer/shroud sub-assembly while the backplane connectors remain unchanged. The wafer/shroud sub-assembly also provides air flow paths between the wafers for thermal management.

While the invention has been described in terms of various specific embodiments, those skilled in the art will recognize that the invention can be practiced with modification within the spirit and scope of the claims.

What is claimed is:

1. A connector assembly for connecting first and second circuit boards in a substantially parallel relationship, said assembly comprising:

a first connector mountable on the first circuit board;

a second connector mountable on the second circuit board; and a third connector matable to said first and second connectors and positioned therebetween, said third connector including a contact wafer having a spacing tab sized to provide a predetermined spacing between the first and second circuit boards.

2. The connector assembly of claim 1, wherein said third connector further includes a first shroud and a second shroud, said first and second shrouds holding said contact wafer.

3. The connector assembly of claim 1, wherein said first and second connectors are identical to one another.

4. The connector assembly of claim 1, said third connector further includes a shroud having an inspection groove and said contact wafer includes an inspection aperture aligned with said groove to facilitate a line of sight inspection of said third connector when said third connector is assembled.

5. The connector assembly of claim 1, wherein said third connector further includes a first shroud and a second shroud, said first and second shrouds having a plurality of grooves formed therein and said contact wafer includes retention barbs that engage bottom surfaces of said grooves to secure said contact wafer in said shrouds.

6. The connector assembly of claim 1, wherein said third connector further includes a first shroud and a second shroud, said first and second shrouds holding said contact wafer and wherein said first and second shrouds are identical to one another.

7. A connector assembly for connecting first and second circuit boards in a substantially parallel relationship, said assembly comprising:

a first connector mountable on the first circuit board;

a second connector mountable on the second circuit board; and a third connector matable to said first and second connectors and positioned therebetween, said third connector including at least two contact wafers defining an air flow path therebetween and through said third connector when said first, second, and third connectors are mated with one another, each of said contact wafers having a spacing tab sized to provide a predetermined spacing between said first and second circuit boards.

8. The connector assembly of claim 7, wherein said third connector further includes a first shroud and a second shroud, said first and second shrouds holding said contact wafers.

9. The connector assembly of claim 7, wherein each said contact wafer includes a spacing tab that defines said air flow path through said third connector.

10. The connector assembly of claim 7, wherein said third connector further includes a first shroud and a second shroud, and said spacing tabs establish a spacing between said first and second shrouds.

11. The connector assembly of claim 7, wherein said third connector further includes a first shroud and a second shroud, and said air flow path is between said first and second shrouds.

12. The connector assembly of claim 7, wherein said first and second connectors are identical to one another.

13. The connector assembly of claim 7, said third connector further includes a shroud having an inspection groove and each said contact wafer includes an inspection aperture aligned with said groove to facilitate a line of sight inspection of said third connector when said third connector is assembled.

14. The connector assembly of claim 7, wherein said third connector further includes a first shroud and a second shroud, said first and second shrouds having a plurality of grooves formed therein and each said contact wafer includes retention barbs that engage bottom surfaces of said grooves to secure said contact wafers in said shrouds.

15. The connector assembly of claim 7, wherein said third connector further includes a first shroud and a second shroud, said first and second shrouds holding said contact wafers and wherein said first and second shrouds are identical to one another.

* * * * *